(12) United States Patent
Ushijima

(10) Patent No.: US 11,502,023 B2
(45) Date of Patent: Nov. 15, 2022

(54) SEMICONDUCTOR DEVICE WITH PARTITION FOR REFRIGERANT COOLING

(71) Applicant: Mitsubishi Electric Corporation, Tokyo (JP)

(72) Inventor: Koichi Ushijima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 139 days.

(21) Appl. No.: 16/963,801

(22) PCT Filed: May 1, 2018

(86) PCT No.: PCT/JP2018/017401
§ 371 (c)(1),
(2) Date: Jul. 21, 2020

(87) PCT Pub. No.: WO2019/211889
PCT Pub. Date: Nov. 7, 2019

(65) Prior Publication Data
US 2021/0057307 A1 Feb. 25, 2021

(51) Int. Cl.
*H01L 23/473* (2006.01)
(52) U.S. Cl.
CPC ................. *H01L 23/473* (2013.01)
(58) Field of Classification Search
CPC .................................................. H01L 23/473
USPC ........................................................ 257/714
See application file for complete search history.

(56) References Cited

U.S. PATENT DOCUMENTS

| 6,992,382 | B2 * | 1/2006 | Chrysler | ............... | H01L 23/473 361/689 |
| 2015/0061111 | A1 * | 3/2015 | Nagai | ................... | H01L 23/473 257/714 |
| 2016/0365301 | A1 | 12/2016 | Takano | | |

(Continued)

FOREIGN PATENT DOCUMENTS

| DE | 102014213084 A1 | 3/2015 |
| DE | 112014005635 T5 | 9/2016 |
| JP | 2012-094747 A | 5/2012 |

(Continued)

OTHER PUBLICATIONS

Office Action issued in JP 2020-516982; mailed by the Japanese Patent Office dated Apr. 20, 2021.

(Continued)

*Primary Examiner* — Ajay Arora
(74) *Attorney, Agent, or Firm* — Studebaker & Brackett PC

(57) ABSTRACT

It is an object to reduce a difference in temperature of a refrigerant between an upstream side and a downstream side of a flow path even in a case where all semiconductor elements generate heat due to inverter operation and the like. A semiconductor device includes at least one semiconductor element, a base plate, a plurality of cooling fins, a jacket, and a partition. The partition is disposed below the plurality of cooling fins in the jacket. The partition has at least one inflow opening to allow the refrigerant having flowed in through the refrigerant inlet to flow through the plurality of cooling fins, and has a portion abutting the jacket on the side of the refrigerant inlet. The at least one inflow opening is located to correspond to the at least one semiconductor element.

11 Claims, 15 Drawing Sheets

(56) References Cited

U.S. PATENT DOCUMENTS

2017/0287809 A1* 10/2017 Schultz ................ H01L 23/473

FOREIGN PATENT DOCUMENTS

| JP | 2012-129280 A | 7/2012 |
| JP | 2015-053318 A | 3/2015 |
| JP | 2017-174991 A | 9/2017 |

OTHER PUBLICATIONS

International Search Report issued in PCT/JP2018/017401; dated Jun. 5, 2018.
An Office Action issued by the German Patent and Trade Mark Office dated Jul. 20, 2022, which corresponds to German Patent Application No. 11 2018 007 544.3 and is related to U.S. Appl. No. 16/963,801; with English language translation.

* cited by examiner

F I G. 3
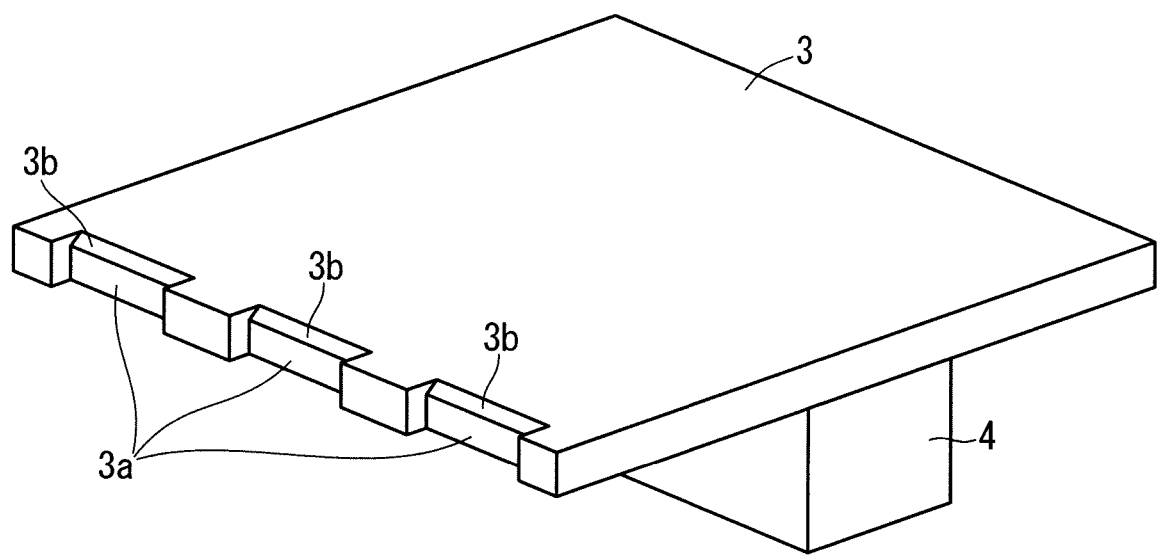

F I G. 1 1
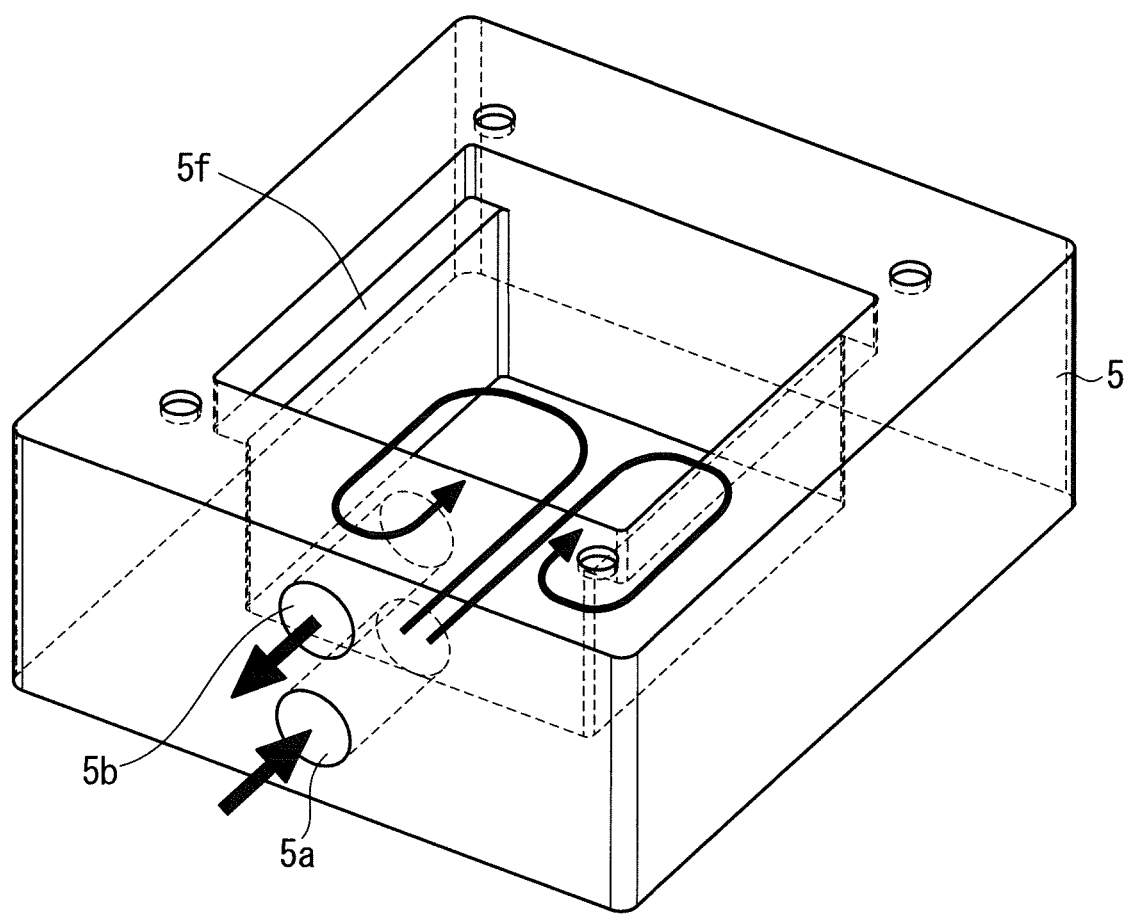

F I G. 1 2
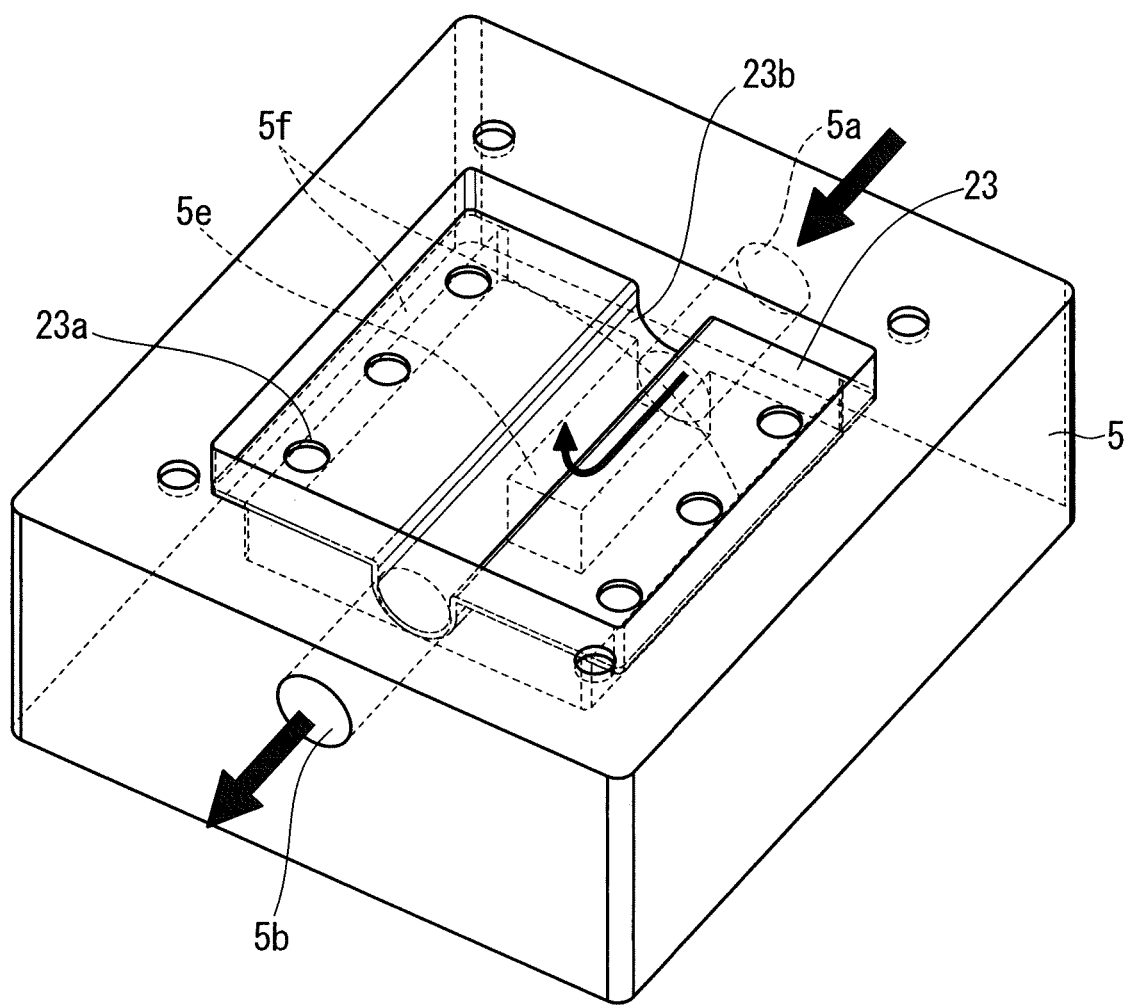

F I G. 1 4
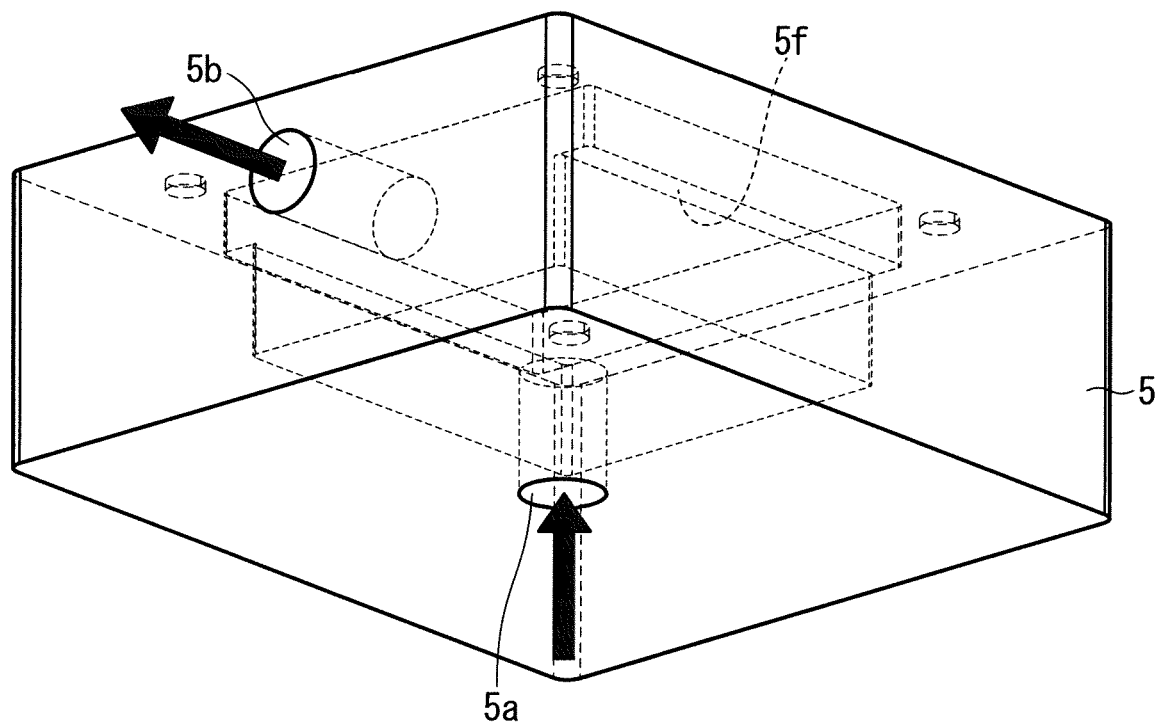

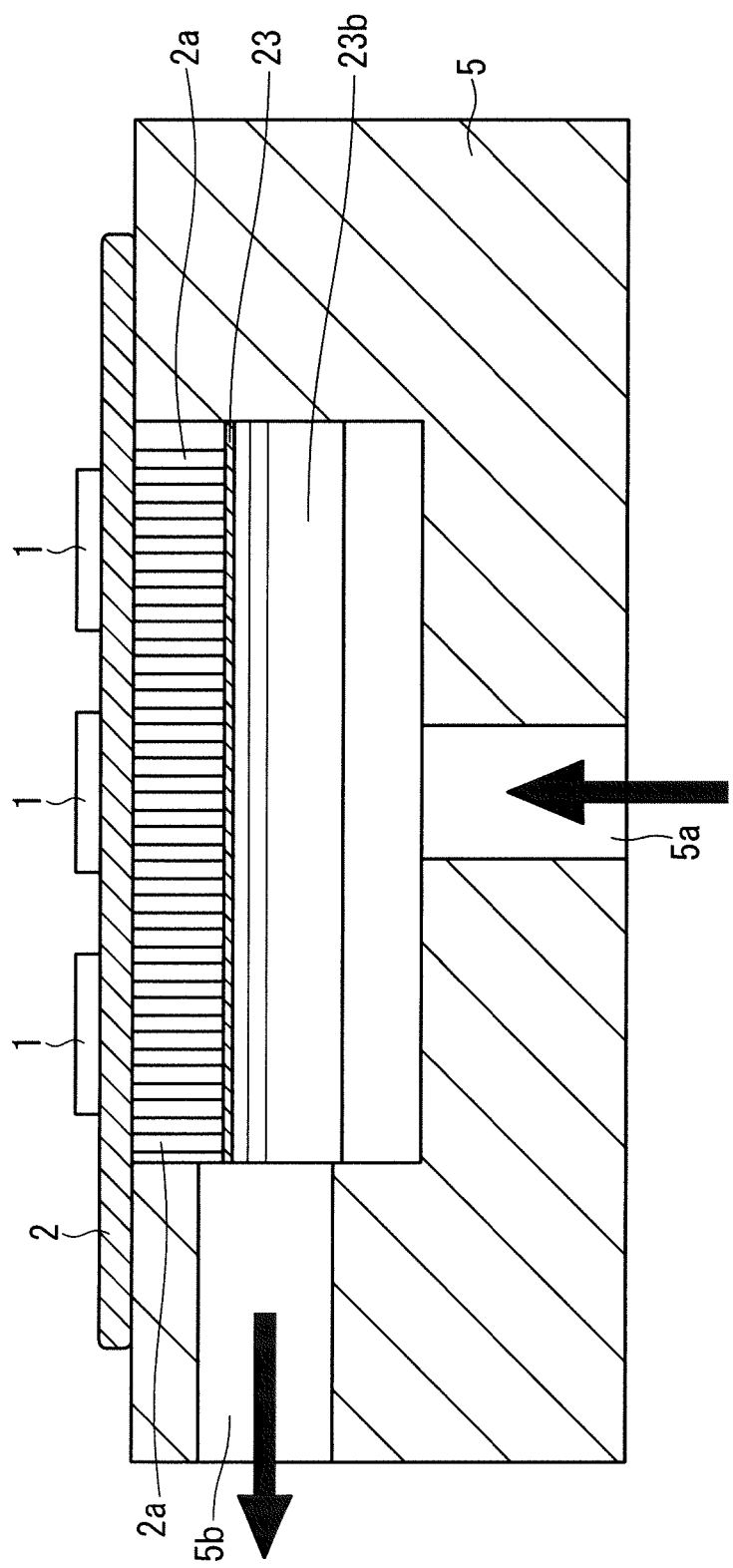

SEMICONDUCTOR DEVICE WITH PARTITION FOR REFRIGERANT COOLING

TECHNICAL FIELD

The present invention relates to a structure to cool a semiconductor device using a fluid.

BACKGROUND ART

In a semiconductor device, a direct-cooled cooling structure in which cooling fins are disposed on a lower surface of a base plate on which semiconductor elements are mounted is sealed to a jacket through a sealing structure. To make a flow rate of a refrigerant flowing through the cooling fins uniform, a partition to allow the refrigerant to flow through the cooling fins is typically disposed on an inflow side and an outflow side of the refrigerant of the cooling fins, that is, horizontally relative to the cooling fins.

The partition is disposed below the cooling fins in some cases. In a semiconductor device disclosed in Patent Document 1, for example, a T-shaped header partition including a horizontal partition and a vertical partition is disposed below cooling fins. A refrigerant having flowed in through a refrigerant inlet flows into the cooling fins through a refrigerant inflow-side gap formed between one end of the horizontal partition on a side of the refrigerant inlet and an inner wall of a jacket in a sealed region between the jacket and a base plate, flows through a refrigerant outflow-side gap formed between the other end of the horizontal partition on a side of a refrigerant outlet and the inner wall of the jacket, and flows out through the refrigerant outlet.

PRIOR ART DOCUMENT

Patent Document

Patent Document 1: Japanese Patent Application Laid-Open No. 2015-53318

SUMMARY

Problem to be Solved by the Invention

In the semiconductor device disclosed in Patent Document 1, however, the refrigerant inflow-side gap is uniform in a whole region, so that the refrigerant having flowed in through the refrigerant inlet is dispersed throughout the cooling fins.

In a case where all semiconductor elements generate heat due to inverter operation and the like, the refrigerant flows into semiconductor elements disposed downstream of a flow path in a state of absorbing heat generated by semiconductor elements disposed upstream of the flow path. This causes a problem in that the temperature of the refrigerant to cool the semiconductor elements disposed downstream becomes higher than the temperature of the refrigerant to cool the semiconductor elements disposed upstream to limit a current-carrying ability of the semiconductor device and to reduce reliability.

It is an object of the present invention to reduce a difference in temperature of a refrigerant between an upstream side and a downstream side of a flow path even in a case where all semiconductor elements generate heat due to inverter operation and the like.

Means to Solve the Problem

A semiconductor device according to the present invention includes: at least one semiconductor element; a base plate having an upper surface on which the at least one semiconductor element is mounted; a plurality of cooling fins disposed on a lower surface of the base plate; a jacket having a refrigerant inlet through which a refrigerant flows in from an outside and a refrigerant outlet through which the refrigerant flows out to the outside, and disposed to surround the plurality of cooling fins on the lower surface of the base plate; and a partition disposed below the plurality of cooling fins in the jacket to allow the refrigerant having flowed in through the refrigerant inlet to flow through the plurality of cooling fins and then flow out through the refrigerant outlet, wherein the partition has at least one inflow opening to allow the refrigerant having flowed in through the refrigerant inlet to flow through the plurality of cooling fins, and has a portion abutting the jacket on a side of the refrigerant inlet, and the at least one inflow opening is located to correspond to the at least one semiconductor element.

Effects of the Invention

According to the present invention, an increase in temperature of the refrigerant can be suppressed by increasing a flow rate of the refrigerant flowing into the cooling fins, so that a difference in temperature of the refrigerant between an upstream side and a downstream side of a flow path can be reduced even in a case where all semiconductor elements generate heat due to inverter operation and the like.

The objects, features, aspects, and advantages of the present invention will become more apparent from the following detailed description and the accompanying drawings.

BRIEF DESCRIPTION OF DRAWINGS

FIG. 3 is a perspective view of a partition of the semiconductor device according to Embodiment 1.

FIG. 11 is a perspective view of a jacket of a semiconductor device according to Embodiment 4.

FIG. 12 is an exploded perspective view of a horizontal partition and a jacket of a semiconductor device according to Embodiment 5.

FIG. 14 is an exploded perspective view of a horizontal partition and a jacket of a semiconductor device according to Embodiment 6.

FIG. 15 is a sectional view of the semiconductor device according to Embodiment 6.

DESCRIPTION OF EMBODIMENTS

Embodiment 1

Figure 1:
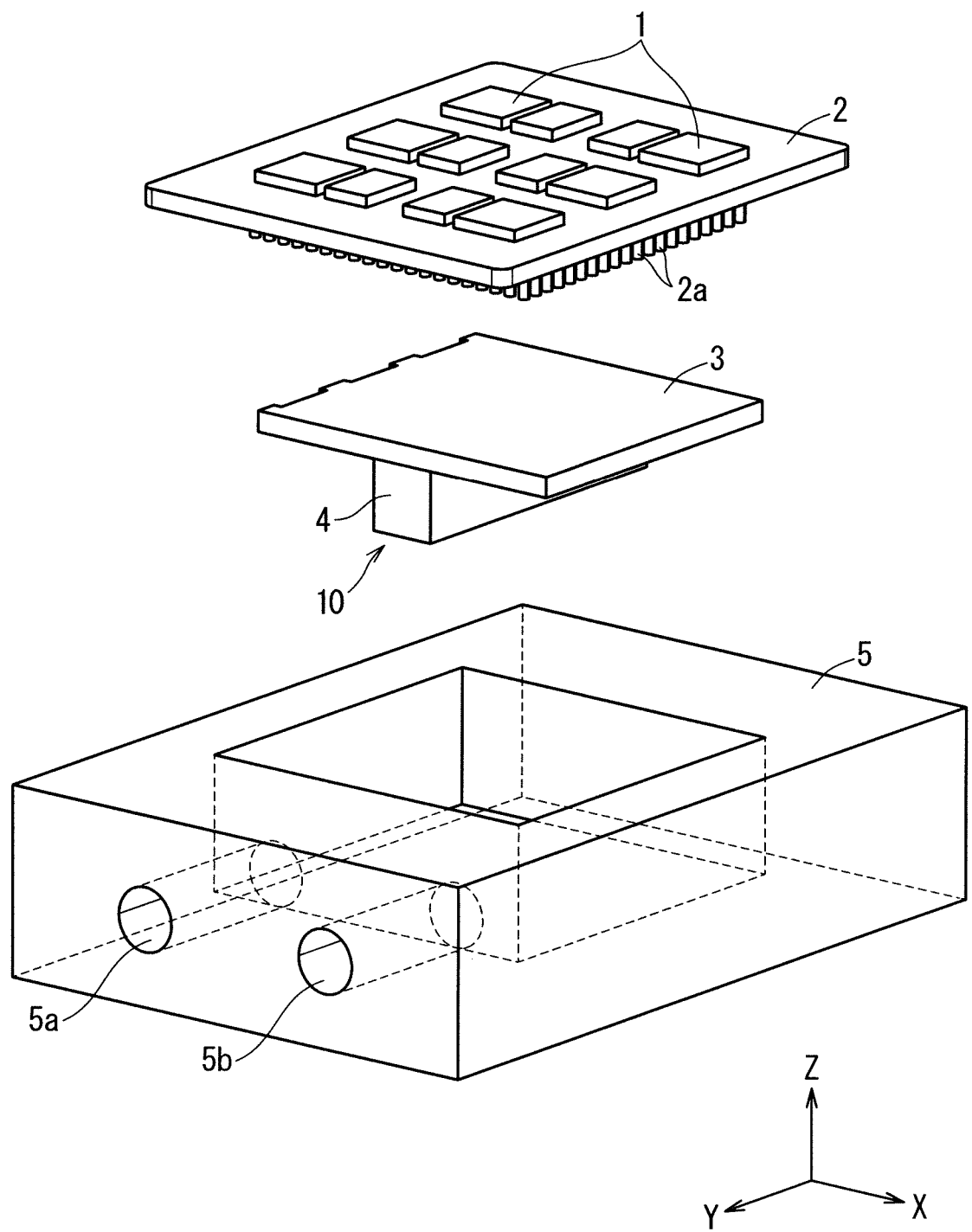
FIG. 1 is an exploded perspective view of a semiconductor device according to Embodiment 1.
Figure 2:
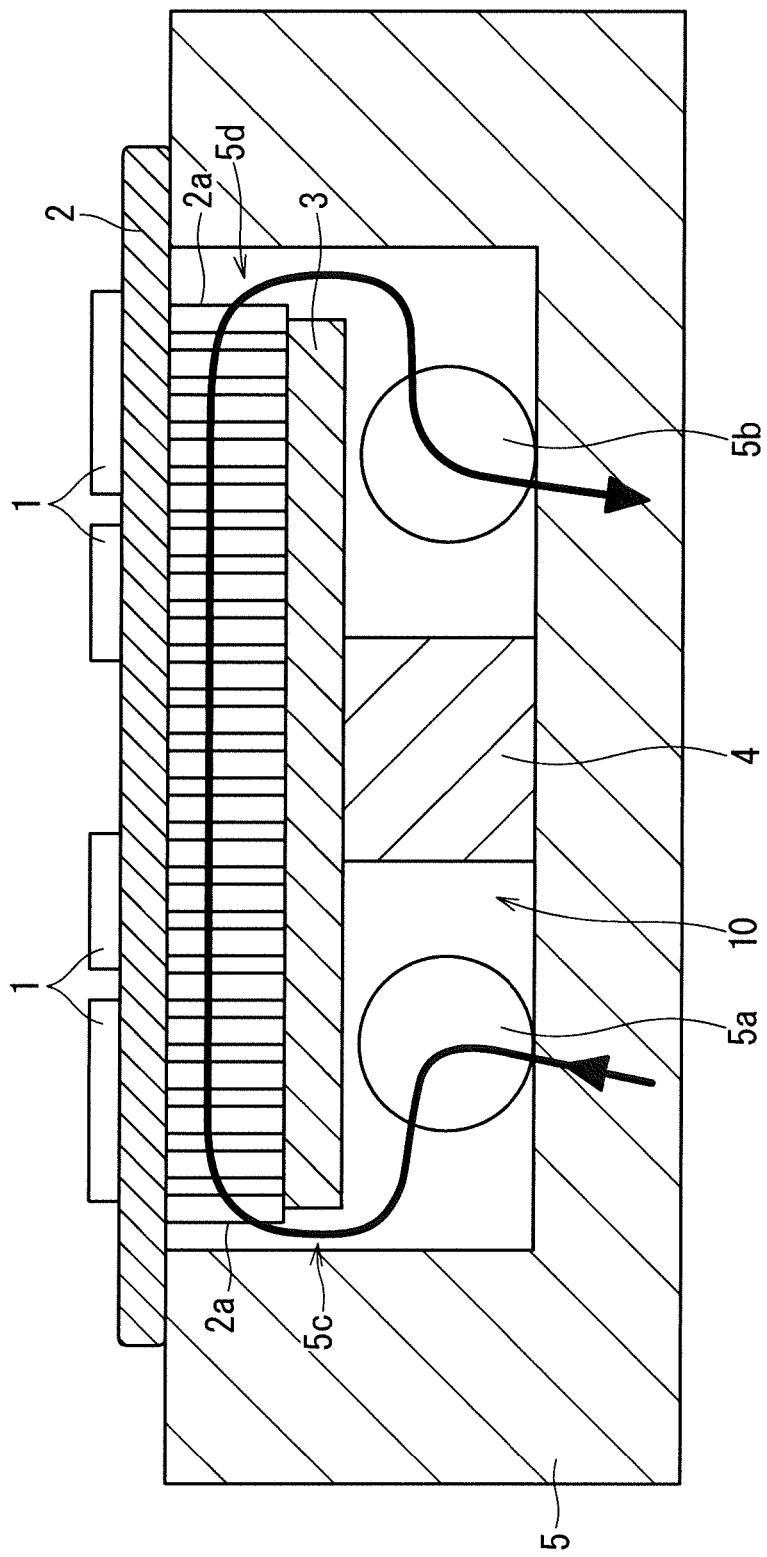
FIG. 2 is a sectional view of the semiconductor device according to Embodiment 1.
Figure 4:
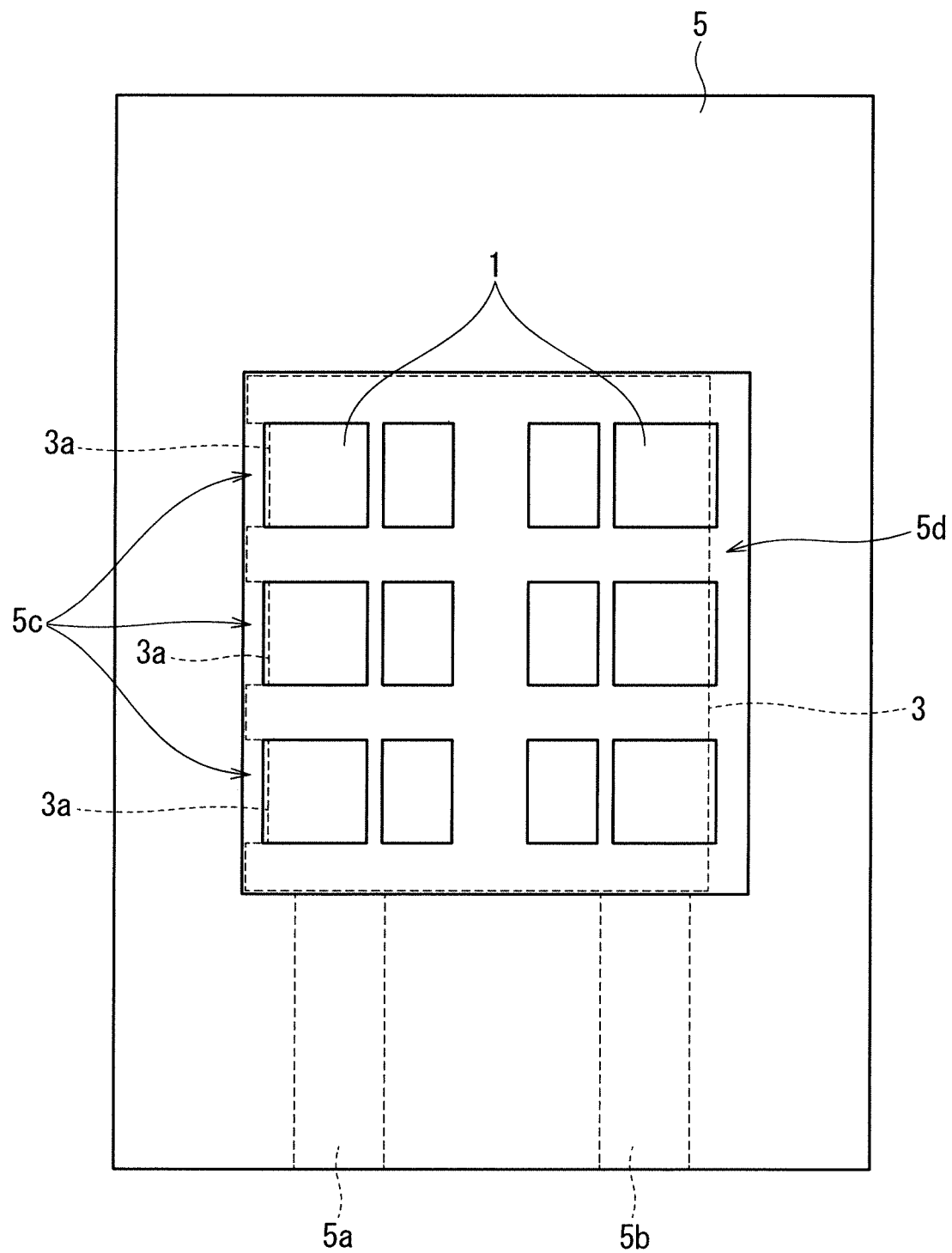
FIG. 4 is a plan view of the semiconductor device according to Embodiment 1.

Embodiment 1 of the present invention will be described below with reference to the drawings. FIG. 1 is an exploded perspective view of a semiconductor device according to Embodiment 1. FIG. 2 is a sectional view of the semiconductor device according to Embodiment 1, and, specifically, is a sectional view of the semiconductor device according to Embodiment 1 taken along a left-right direction at a location of cutouts 3a of a partition, which will be described below. FIG. 3 is a perspective view of the partition of the semiconductor device according to Embodiment 1. FIG. 4 is a plan view of the semiconductor device. For ease of description, XYZ coordinate axes are shown in FIG. 1. Description is made herein on the assumption that a +X direction is a rightward direction, a −X direction is a leftward direction, a +Y direction is a forward direction, a −Y direction is a backward direction, a +Z direction is an upward direction, and a −Z direction is a downward direction.

As illustrated in FIGS. 1 and 2, the semiconductor device according to Embodiment 1 includes at least one semiconductor element 1, a base plate 2, a plurality of cooling fins 2a, a jacket 5, and a partition 10. The semiconductor element 1 is mounted on an upper surface of the base plate 2. A total of 12 semiconductor elements 1 including four semiconductor elements 1 in the left-right direction and three semiconductor elements 1 in a front-back direction are arranged in FIG. 1. The number of semiconductor elements 1 is not limited to 12, and may be any number equal to or greater than one.

The plurality of cooling fins 2a are disposed on a lower surface of the base plate 2. More specifically, the plurality of cooling fins 2a are disposed, on the lower surface of the base plate 2, in a region corresponding to a region in which the semiconductor elements 1 mounted on the upper surface of the base plate 2 are arranged. The cooling fins 2a are disposed at predetermined intervals to protrude downward from the lower surface of the base plate 2. The cooling fins 2a are pin fins, and are made, for example, of metal having high thermal conductivity to enhance a heat dissipation effect.

The jacket 5 is a recessed member to allow a refrigerant to flow through the cooling fins 2a. The jacket 5 is sealed to surround the plurality of cooling fins 2a on the lower surface of the base plate 2. More specifically, the jacket 5 is fixed using a bolt and the like in a state of being in close contact with a peripheral portion of a region in which the plurality of cooling fins 2a are disposed on the lower surface of the base plate 2.

The jacket 5 has a refrigerant inlet 5a through which the refrigerant flows in from an outside and a refrigerant outlet 5b through which the refrigerant flows out to the outside. The refrigerant inlet 5a extends, in the front-back direction, from a left side of a middle portion in the left-right direction of a front wall of the jacket 5 to be in communication with a space inside the jacket 5. The refrigerant outlet 5b extends, in the front-back direction, from a right side of the middle portion in the left-right direction of the front wall of the jacket 5 to be in communication with the space inside the jacket 5. The refrigerant inlet 5a and the refrigerant outlet 5b are located at the same level.

As illustrated in FIGS. 1 and 2, the partition 10 is disposed below the plurality of cooling fins 2a in the jacket 5, and forms, together with an inner side wall and a bottom wall of the jacket 5, a flow path to allow the refrigerant having flowed in through the refrigerant inlet 5a to flow through the plurality of cooling fins 2a, and then flow out through the refrigerant outlet 5b. More specifically, the partition 10 has at least one inflow opening 5c to allow the refrigerant having flowed in through the refrigerant inlet 5a to flow through the plurality of cooling fins 2a and one outflow opening 5d to allow the refrigerant having flowed through the plurality of cooling fins 2a to flow out through the refrigerant outlet 5b. An arrow in FIG. 2 represents a direction of a flow of the refrigerant.

The partition 10 includes a horizontal partition 3 located at a lower end of the plurality of cooling fins 2a and a vertical partition 4 located below the horizontal partition 3, and the horizontal partition 3 and the vertical partition 4 form a T-shape. A lower end portion of the vertical partition 4 is fixed to the bottom wall of the jacket 5 using a bolt and the like to fix the partition 10 in the jacket 5.

The lower end of the cooling fins 2a abuts an upper surface of the horizontal partition 3, and the inflow opening 5c is formed at a left end as one end of the horizontal partition 3. The outflow opening 5d is formed at a right end as the other end of the horizontal partition 3.

The structure of the horizontal partition 3 will be described in detail next. As illustrated in FIGS. 1 and 3, the horizontal partition 3 is rectangular in plan view, and has, in one end portion, a plurality of cutouts 3a formed at predetermined intervals. The plurality of cutouts 3a are located only to correspond to the semiconductor elements 1. More specifically, three cutouts 3a are located to correspond to respective three semiconductor elements 1 arranged at the left end in the front-back direction, and the cutouts 3a serve as the above-mentioned inflow opening 5c.

Connection portions 3b to connect the three cutouts 3a and the upper surface of the horizontal partition 3 are tapered or curved. This smoothes a flow of the refrigerant from the connection portions 3b to the plurality of cooling fins 2a through the upper surface of the horizontal partition 3 to reduce a pressure loss. The number of cutouts 3a is not limited to three, and is increased or decreased to correspond to the number of semiconductor elements 1 arranged at the left end in the front-back direction.

As illustrated in FIGS. 2 and 4, the length of the horizontal partition 3 in the left-right direction is shorter than the length of the space inside the jacket 5 in the left-right direction, and the length of the horizontal partition 3 in the front-back direction is slightly shorter than the length of the space inside the jacket 5 in the front-back direction. The left end as one end of the horizontal partition 3 on a side of the refrigerant inlet 5a abuts the inner side wall of the jacket 5, and a refrigerant inflow-side gap is formed between the left end of the horizontal partition 3 and the inner side wall of the jacket 5. More specifically, the refrigerant inflow-side gap is formed between the cutouts 3a of the horizontal partition 3 and the inner side wall of the jacket 5.

The refrigerant inflow-side gap as the inflow opening 5c is disposed only at a location at which the semiconductor elements 1 are arranged, and is not disposed at a location at which the semiconductor elements 1 are not arranged. That is to say, no gap is disposed at the location at which the semiconductor elements 1 are not arranged. The refrigerant having flowed in through the inflow opening 5c can thereby be concentrated to flow immediately below the semiconductor elements 1. This can increase a flow rate of the refrigerant flowing immediately below the semiconductor elements 1 to thereby suppress an increase in temperature of the refrigerant. A difference in temperature of the refrigerant between an upstream side and a downstream side of the flow path can be reduced to suppress a variation in temperature of the plurality of semiconductor elements 1.

On the other hand, the right end as the other end of the horizontal partition 3 on a side of the refrigerant outlet 5b does not abut the inner side wall, of the jacket 5, and a refrigerant outflow-side gap is formed between the right end of the horizontal partition 3 and the inner side wall of the jacket 5. The refrigerant outflow-side gap is uniform in a whole region, and serves as the outflow opening 5d.

As described above, in the semiconductor device according to Embodiment 1, the partition 10 has the at least one inflow opening 5c to allow the refrigerant having flowed in through the refrigerant inlet 5a to flow through the plurality of cooling fins 2a, and has a portion abutting the jacket 5 on the side of the refrigerant inlet 5a, and the at least one inflow opening 5c is located to correspond to the at least one semiconductor element 1. The increase in temperature of the refrigerant can be suppressed by increasing the flow rate of the refrigerant flowing through the cooling fins 2a, so that the difference in temperature of the refrigerant between the upstream side and the downstream side of the flow path can be reduced even in a case where all the semiconductor elements 1 generate heat due to inverter operation and the like. Durability of the semiconductor device can thus be improved.

The partition 10 includes the horizontal partition 3 located at the lower end of the plurality of cooling fins 2a and the vertical partition 4 located below the horizontal partition 3, and the at least one inflow opening 5c is the refrigerant inflow-side gap formed between one end of the horizontal partition 3 on the side of the refrigerant inlet 5a and the inner side wall of the jacket 5. The refrigerant inflow-side gap can easily be achieved by forming the plurality of cutouts 3a in the one end portion of the horizontal partition 3, so that an increase in manufacturing cost of the semiconductor device can be suppressed without complicating the structure of the partition 10.

Embodiment 2

Figure 5:
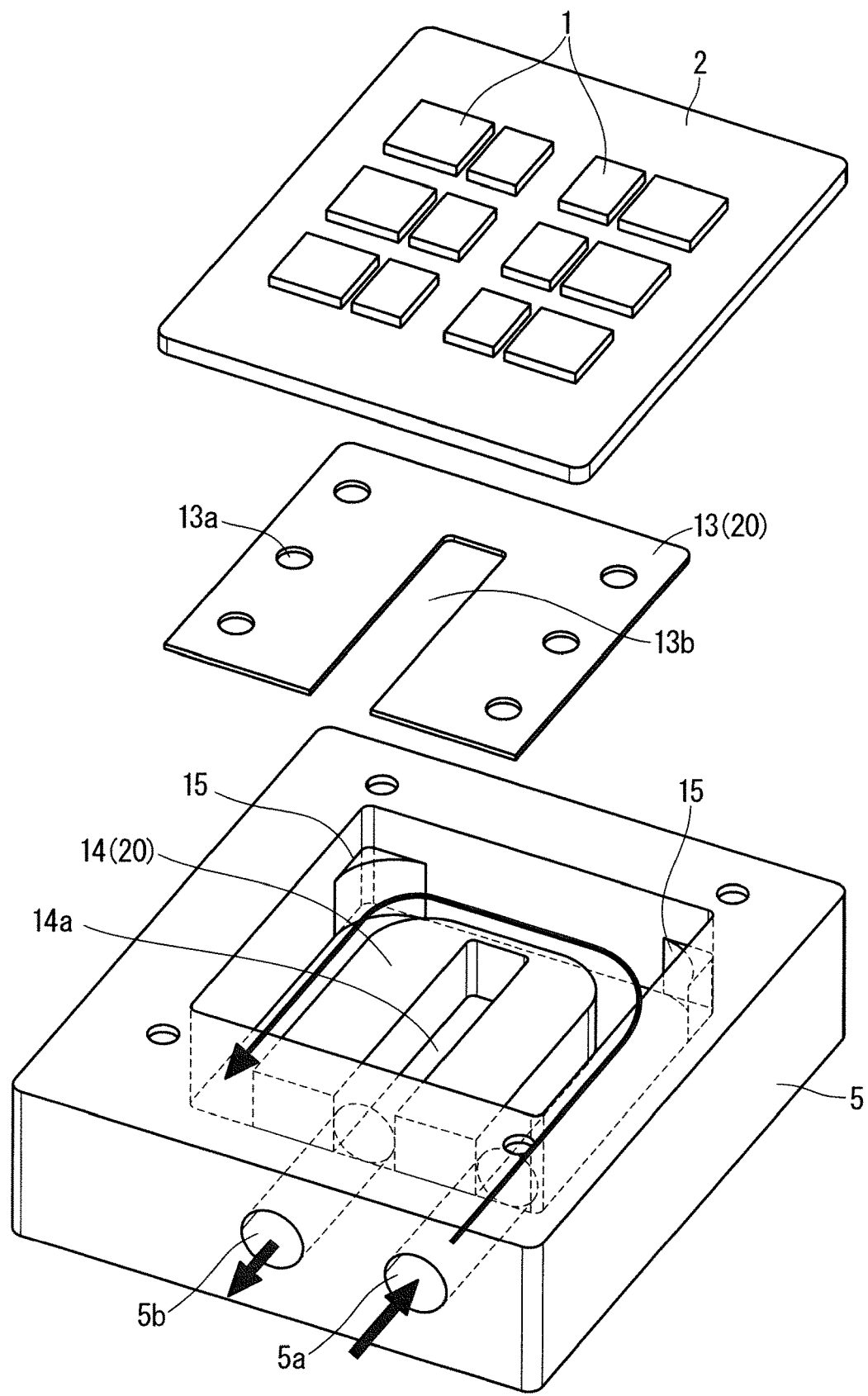
FIG. 5 is an exploded perspective view of a semiconductor device according to Embodiment 2.
Figure 6:
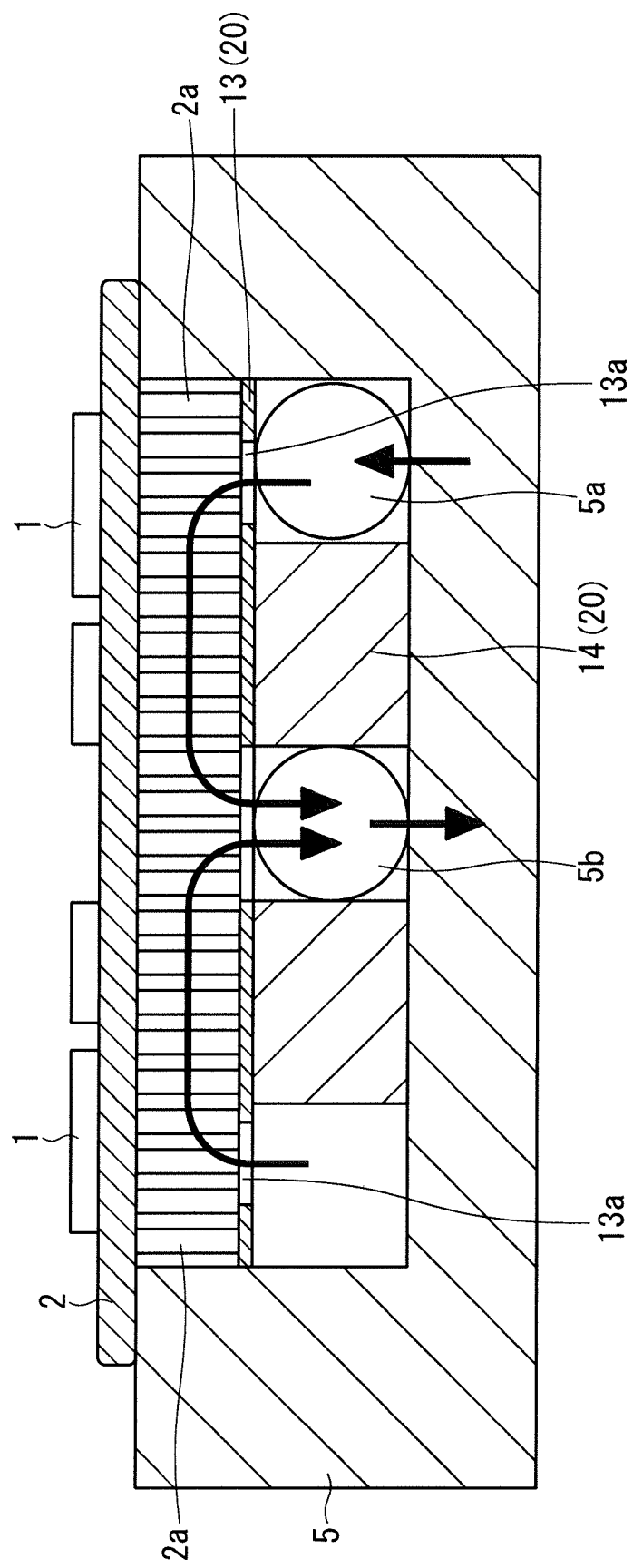
FIG. 6 is a sectional view of the semiconductor device according to Embodiment 2.
Figure 7:
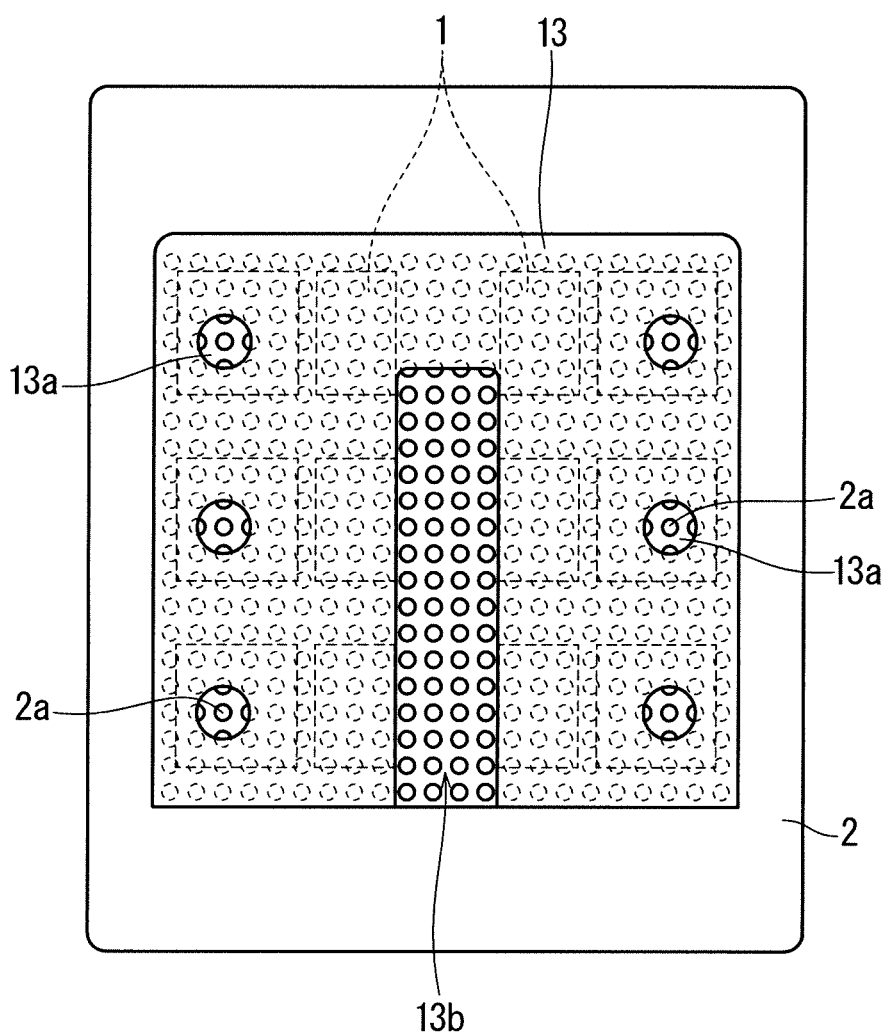
FIG. 7 is a bottom-up view of a horizontal partition of the semiconductor device according to Embodiment 2.

A semiconductor device according to Embodiment 2 will be described next. FIG. 5 is an exploded perspective view of the semiconductor device according to Embodiment 2. FIG. 6 is a sectional view of the semiconductor device according to Embodiment 2, and, specifically, is a sectional view of the semiconductor device according to Embodiment 2 taken along the left-right direction. FIG. 7 is a bottom-up view of a horizontal partition 13 of the semiconductor device according to Embodiment 2. In Embodiment 2, the same components as those described in Embodiment 1 bear the same reference signs, and description thereof is omitted.

In the semiconductor device according to Embodiment 1, in a case where the cooling fins 2a are closely spaced or in a case where the cooling fins 2a are staggered relative to the direction of the flow of the refrigerant, a flow rate of the refrigerant to cool semiconductor elements 1 located to correspond to the downstream side is reduced, so that the semiconductor elements 1 located to correspond to the downstream side sometimes cannot sufficiently be cooled. There is also a tendency for a pressure loss to increase because the area of the inflow opening 5c as the refrigerant inflow-side gap is small to increase a load on a pump to supply the refrigerant. The semiconductor device according to Embodiment 2 has been conceived to solve such a problem.

As illustrated in FIGS. 5 and 6, the semiconductor device according to Embodiment 2 includes the at least one semiconductor element 1, the base plate 2, the plurality of cooling fins 2a, the jacket 5, and a partition 20.

The jacket 5 has the refrigerant inlet 5a and the refrigerant outlet 5b. The refrigerant inlet 5a extends, in the front-back direction, from the right side of the middle portion in the left-right direction of the front wall of the jacket 5 to be in communication with the space inside the jacket 5. The refrigerant outlet 5b extends, in the front-back direction, from the middle portion in the left-right direction of the front wall of the jacket 5 to be in communication with the space inside the jacket 5. The refrigerant inlet 5a and the refrigerant outlet 5b are located at the same level.

The partition 20 is disposed below the plurality of cooling fins 2a in the jacket 5, and forms, together with the inner side wall and the bottom wall of the jacket 5, the flow path to allow the refrigerant having flowed in through the refrigerant inlet 5a to flow through the plurality of cooling fins 2a, and then flow out though the refrigerant outlet 5b. More specifically, the partition 20 has at least one inflow opening 13a to allow the refrigerant having flowed in through the refrigerant inlet 5a to flow through the plurality of cooling fins 2a and one outflow opening 13b to allow the refrigerant having flowed through the plurality of cooling fins 2a to flow out through the refrigerant outlet 5b. An arrow in FIG. 5 represents the direction of the flow of the refrigerant.

The partition 20 includes a horizontal partition 13 located at the lower end of the plurality of cooling fins 2a and a vertical partition 14 located below the horizontal partition 13. A lower end portion of the vertical partition 14 is fixed to the bottom wall of the jacket 5 using the bolt and the like to fix the partition 20 in the jacket 5.

The vertical partition 14 has a U-shape in plan view, and is fixed with two leading end portions of the U-shape being directed forward. The vertical partition 14 has a refrigerant outflow groove 14a in communication with the refrigerant outlet 5b. The refrigerant outflow groove 14a is a groove portion to open forward and extend backward of the U-shape, and is located behind the refrigerant outlet 5b to be in communication with the refrigerant outlet 5b. The refrigerant inlet 5a is located on a right side of a right leading end portion of the vertical partition 14 having the U-shape. Back end portions of the vertical partition 14 are curved to smooth the flow of the refrigerant. Supports 15 having the same thickness as the vertical partition 14 are disposed at two corners in the jacket 5, that is, at locations to face the respective back end portions of the vertical partition 14, and surfaces on front sides of the supports 15 are curved to smooth the flow of the refrigerant.

The horizontal partition 13 has a U-shape in plan view, and has a shape obtained by cutting out a front end to a back end portion of a middle portion in the left-right direction of a planar member. The horizontal partition 13 is fixed to upper surfaces of the vertical partition 14 and the supports 15 with two leading end portions of the U-shape being directed forward. The horizontal partition 13 has the inflow openings 13a and the outflow opening 13b.

The outflow opening 13b is a portion of the front end to the back end portion of the middle portion in the left-right direction cut out of the horizontal partition wall 13. The inflow openings 13a are circular in plain view, and are formed in portions of the horizontal partition 13 extending in the front-back direction from left and right sides so that three inflow openings are arranged in each of the portions in the front-back direction. The inflow openings 13a are located immediately below a region of the base plate 2 in which the plurality of semiconductor elements 1 are disposed. More specifically, the inflow openings 13a are located immediately below semiconductor elements 1 arranged at a left end and a right end of the base plate 2. The number of inflow openings 13a is not limited to six, and is increased or decreased to correspond to the number of semiconductor elements 1 arranged at the left end and the right end of the base plate 2.

The outflow opening 13b is located immediately below a region of the base plate 2 in which the semiconductor elements 1 are not disposed. More specifically, the outflow opening 13b is located immediately below a middle portion in the left-right direction of the base plate 2. The outflow opening 13b has the same outline as the refrigerant outflow groove 14a in plan view, is located immediately above the refrigerant outflow groove 14a, and is in communication with the refrigerant outflow groove 14a.

This allows the refrigerant having flowed in through the refrigerant inlet 5a to flow through the left and right inflow openings 13a toward the plurality of cooling fins 2a while flowing along a periphery of the vertical partition 14. The refrigerant having passed through the plurality of cooling fins 2a passes through the outflow opening 13b to the refrigerant outflow groove 14a, and flows out through the refrigerant outlet 5b to the outside.

A positional relationship between each of the inflow openings 13a and the plurality of cooling fins 2a will be described next. As illustrated in FIG. 7, arrangement of a plurality of cooling fins 2a located to correspond to each of the inflow openings 13a is the same. In FIG. 7, one cooling fin 2a is located at a center portion of each of the inflow openings 13a, and four cooling fins 2a around the one cooling fin 2a are located on a circumference of each of the inflow openings 13a.

The refrigerant having flowed out through each of the inflow openings 13a thus flows in the same manner, so that the amount of refrigerant flowing immediately below each of the semiconductor elements 1 can be made more uniform. An effect of cooling each of the semiconductor elements 1 can thus be made more uniform. Arrangement of the plurality of cooling fins 2a located to correspond to each of the inflow openings 13a is not limited to that in an example illustrated in FIG. 7 as long as it is the same, and may be set freely.

As described above, in the semiconductor device according to Embodiment 2, the partition 20 includes the horizontal partition 13 located at the lower end of the plurality of cooling fins 2a and the vertical partition 14 located below the horizontal partition 13, and the horizontal partition 13 has the at least one inflow opening 13a located immediately below the region of the base plate 2 in which the at least one semiconductor element 1 is disposed and the outflow opening 13b located immediately below the region of the base plate 2 in which the at least one semiconductor element 1 is not disposed.

The refrigerant thus flows from a location immediately below the region of the base plate 2 in which the semiconductor elements 1 are disposed toward a location immediately below the region of the base plate 2 in which the semiconductor elements 1 are not disposed, so that the amount and the flow rate of the refrigerant flowing immediately below each of the semiconductor elements 1 can be made more uniform. The effect of cooling each of the semiconductor elements 1 can thus be made more uniform, so that the semiconductor elements 1 located to correspond to the downstream side can sufficiently be cooled even in a case where the cooling fins 2a are closely spaced or in a case where the cooling fins 2a are staggered relative to the direction of the flow of the refrigerant. The area of each of the inflow openings 13a can be increased to reduce the pressure loss to thereby reduce the load on the pump to supply the refrigerant.

The vertical partition 14 has the refrigerant outflow groove 14a in communication with the outflow opening 13b and the refrigerant outlet 5b. The refrigerant having flowed through the plurality of cooling fins flows through the outflow opening 13b and the refrigerant outflow groove 14a, and flows out through the refrigerant outlet 5b. The refrigerant having passed through the cooling fins 2a can thus efficiently flows out to the outside.

The at least one inflow opening 13a includes a plurality of inflow openings 13a, and arrangement of a plurality of cooling fins 2a located to correspond to each of the inflow openings 13a is the same, so that the refrigerant having flowed out through each of the inflow openings 13a thus flows in the same manner, and the amount of refrigerant flowing immediately below each of the semiconductor elements 1 can be made more uniform. The effect of cooling each of the semiconductor elements 1 can thus be made more uniform.

In the semiconductor device according to Embodiment 2, the number of refrigerant inlets 5a as openings to supply the refrigerant from the outside to the jacket 5 is one to solve a problem, which is caused in a case where pipes to supply the refrigerant are disposed external to the jacket 5, in that the pipes are complicated, piping resistance and a difference in pressure of the refrigerant cause a difference in flow rate and pressure of the refrigerant flowing through each of the pipes, and a variation in effect of cooling the semiconductor elements 1 is caused.

While a refrigerant at a high temperature collects above a refrigerant at a low temperature, in the semiconductor device according to Embodiment 2, the refrigerant flows out horizontally from the refrigerant outflow groove 14a through the refrigerant outlet 5b to alleviate retention of the refrigerant at the high temperature.

In the semiconductor device according to Embodiment 2, the horizontal partition 13 is present to allow the refrigerant to flow immediately below a plurality of cooling fins 2a corresponding to a location around the semiconductor elements 1, so that a problem of reduction of the cooling effect around the semiconductor elements 1 is not caused.

In the semiconductor device according to Embodiment 2, the refrigerant is supplied to each of the semiconductor elements 1, so that a problem in that an effect of cooling semiconductor elements located downstream is reduced by a difference in temperature between the refrigerant flowing immediately below the semiconductor elements 1 located downstream of the flow path and the refrigerant flowing immediately below semiconductor elements 1 located upstream of the flow path is not caused.

Modification of Embodiment 2

Figure 8:
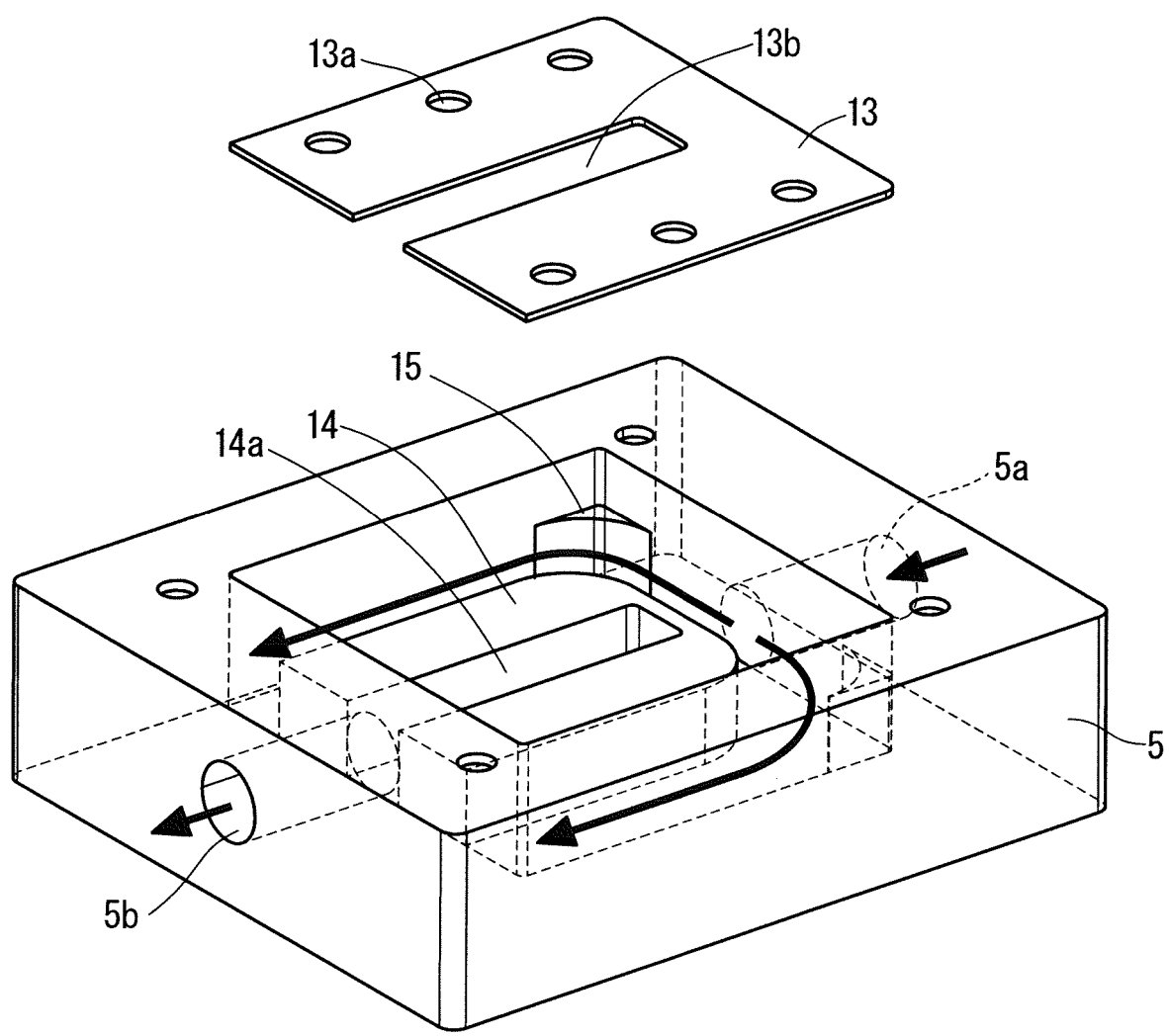
FIG. 8 is an exploded perspective view of a horizontal partition, a vertical partition, and a jacket of a semiconductor device according to a modification of Embodiment 2.

A semiconductor device according to a modification of Embodiment 2 will be described next. FIG. 8 is an exploded perspective view of the horizontal partition 13, the vertical partition 14, and the jacket 5 of the semiconductor device according to the modification of Embodiment 2.

In the semiconductor device according to Embodiment 2, the refrigerant inlet 5a is disposed on the right side of the vertical partition 14, so that there is a large difference between the distance from the refrigerant inlet 5a to the left inflow openings 13a and the distance from the refrigerant inlet 5a to the right inflow openings 13a. This causes a difference in flow rate and pressure of the refrigerant between the left inflow openings 13a and the right inflow openings 13a to sometimes cause the variation in temperature of the semiconductor elements 1. The semiconductor device according to the modification of Embodiment 2 has been conceived to solve such a problem.

As illustrated in FIG. 8, the location of the refrigerant inlet 5a is changed in the semiconductor device according to the modification of Embodiment 2. The refrigerant inlet 5a and the refrigerant outlet 5b face each other with the vertical partition 14 disposed therebetween. More specifically, the refrigerant inlet 5a extends from a middle portion in the left-right direction of a back wall of the jacket 5 to the vicinity of a middle portion in the left-right direction of a back end of the vertical partition 14. The difference between the distance from the refrigerant inlet 5a to the left inflow openings 13a and the distance from the refrigerant inlet 5a to the right inflow openings 13a is reduced to reduce the difference in flow rate and pressure of the refrigerant between the left inflow openings 13a and the right inflow openings 13a.

As described above, in the semiconductor device according to the modification of Embodiment 2, the refrigerant inlet 5a and the refrigerant outlet 5b face each other with the vertical partition 14 disposed therebetween to reduce the difference in flow rate and pressure of the refrigerant between the left inflow openings 13a and the right inflow openings 13a to thereby reduce the variation in temperature of the semiconductor elements 1.

Embodiment 3

Figure 9:
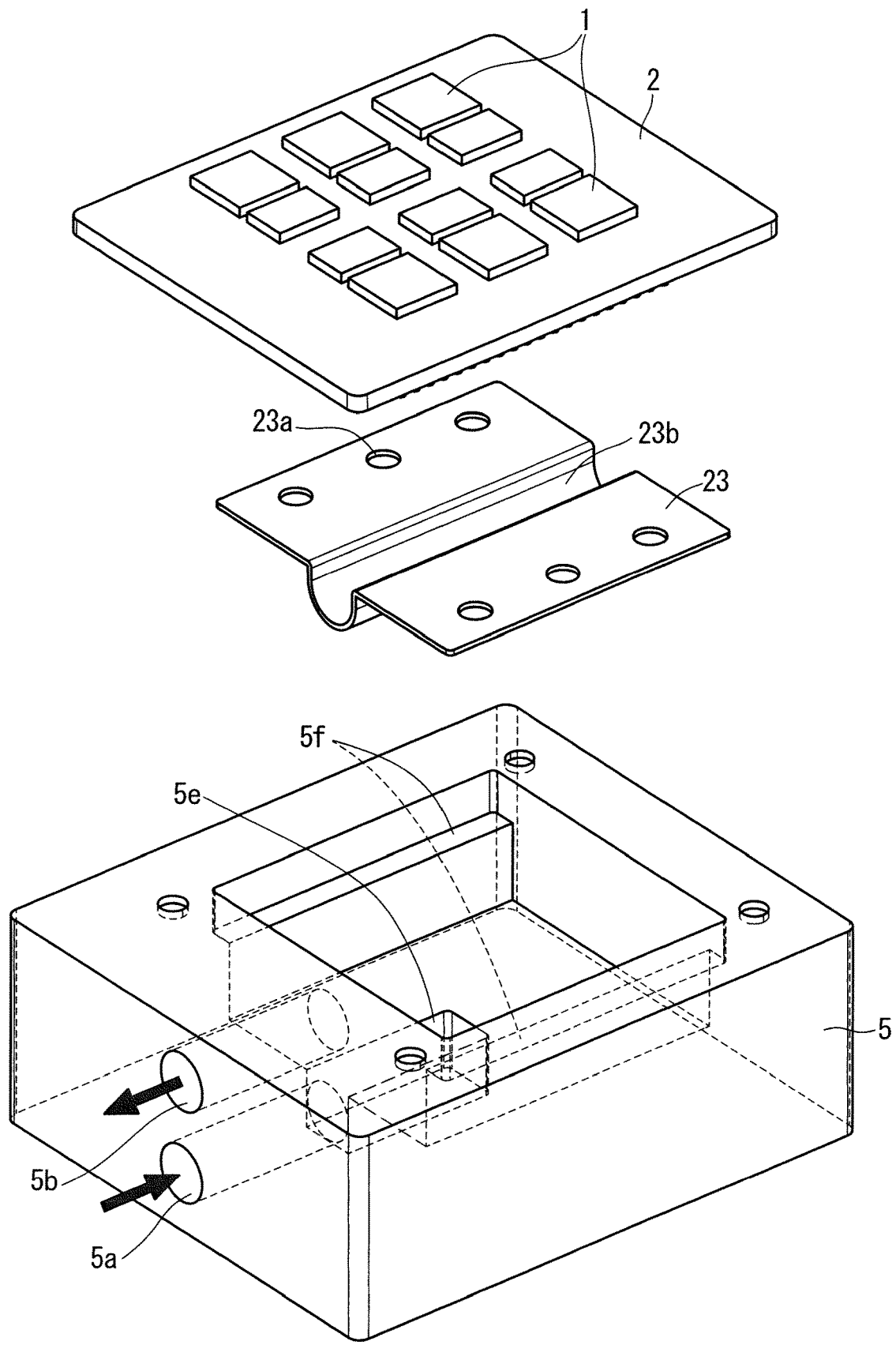
FIG. 9 is an exploded perspective view of a semiconductor device according to Embodiment 3.
Figure 10:
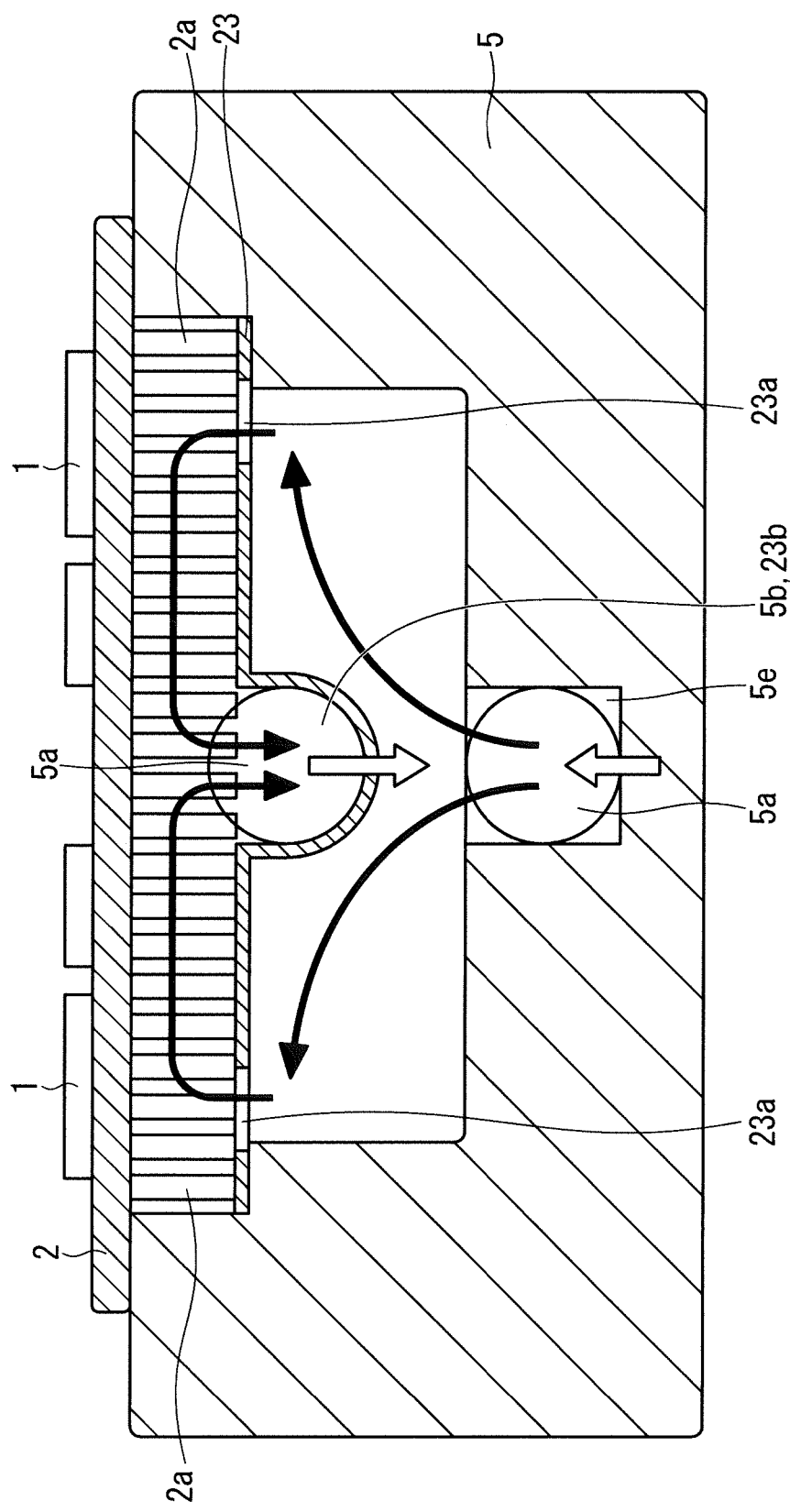
FIG. 10 is a sectional view of the semiconductor device according to Embodiment 3.

A semiconductor device according to Embodiment 3 will be described next. FIG. 9 is an exploded perspective view of the semiconductor device according to Embodiment 3. FIG. 10 is a sectional view of the semiconductor device according to Embodiment 3, and, specifically, is a sectional view of the semiconductor device according to Embodiment 3 taken along the left-right direction. In Embodiment 3, the same components as those described in Embodiments 1 and 2 bear the same reference signs, and description thereof is omitted.

In the semiconductor device according to the modification of Embodiment 2, the variation in temperature of the semiconductor elements 1 can be reduced by reducing the difference between the distance from the refrigerant inlet 5a to the left inflow openings 13a and the distance from the refrigerant inlet 5a to the right inflow openings 13a, but the difference in flow rate and pressure of the refrigerant is still caused between the left inflow openings 13a and the right inflow openings 13a to sometimes cause the variation in temperature of the semiconductor elements 1. The semiconductor device according to Embodiment 3 has been conceived to solve such a problem.

As illustrated in FIGS. 9 and 10, the semiconductor device according to Embodiment 3 includes the at least one semiconductor element 1, the base plate 2, the plurality of cooling fins 2a, the jacket 5, and a horizontal partition 23 as the partition.

The jacket 5 has the refrigerant inlet 5a, the refrigerant outlet 5b, a refrigerant inflow groove 5e in communication with the refrigerant inlet 5a, and horizontal partition supports 5f. The refrigerant inlet 5a and the refrigerant outlet 5b are disposed parallel in a vertical direction, and the refrigerant inlet 5a is located below the refrigerant outlet 5b.

The horizontal partition 23 is rectangular in plan view, and has a shape recessed downward from a front end to a back end in a middle portion in the left-right direction. The horizontal partition 23 has inflow openings 23a and a refrigerant outflow groove 23b.

The inflow openings 13a are located immediately below the region of the base plate 2 in which the at least one semiconductor element 1 is disposed. The refrigerant outflow groove 23b is the above-mentioned portion recessed downward, and is located immediately below the region of the base plate 2 in which the at least one semiconductor element 1 is not disposed. The refrigerant outflow groove 23b is located behind the refrigerant outlet 5b at the same level as the refrigerant outlet 5b, and is in communication with the refrigerant outlet 5b. The refrigerant inflow groove 5e is located below the refrigerant outflow groove 23b. More specifically, the refrigerant inflow groove 5e is located behind the refrigerant inlet 5a at the same level as the refrigerant inlet 5a, and is in communication with the refrigerant inlet 5a.

The horizontal partition supports 5f are steps formed from front ends to back ends of left and right inner side walls of the jacket 5 to support left and right end portions of the horizontal partition 23.

The refrigerant having flowed in through the refrigerant inlet 5a of the jacket 5 is jetted upward from the refrigerant inflow groove 5e to impinge on a portion of a lower surface of the horizontal partition 23 corresponding to the refrigerant outflow groove 23b to be dispersed uniformly to the left and right. The refrigerant filled in a space between the jacket 5 and the horizontal partition 23 is thereby jetted uniformly through the inflow openings 23a of the horizontal partition 23 toward the cooling fins 2a. The refrigerant having passed through the cooling fins 2a flows through the refrigerant outflow groove 23b, and flows out through the refrigerant outlet 5b, so that the semiconductor elements 1 have uniform temperatures without thermal interference from the refrigerant.

As described above, in the semiconductor device according to Embodiment 3, the partition is the horizontal partition 23 located at the lower end of the plurality of cooling fins 2a, and has the at least one inflow opening 23a located immediately below the region of the base plate 2 in which the at least one semiconductor element 1 is disposed and the refrigerant outflow groove 23b located immediately below the region of the base plate 2 in which the at least one semiconductor element 1 is not disposed and being in communication with the refrigerant outlet 5b, and the refrigerant outflow groove 23b is located at the same level as the refrigerant outlet 5b. The jacket 5 further has the refrigerant inflow groove 5e in communication with the refrigerant inlet 5a, and the refrigerant inflow groove 5e is located below the refrigerant outflow groove 23b. The refrigerant inflow groove 5e faces the portion of the lower surface of the horizontal partition 23 corresponding to the refrigerant outflow groove 23b, and the refrigerant having flowed in through the refrigerant inlet 5a is jetted upward from the refrigerant inflow groove 5e to impinge on the portion of the lower surface of the horizontal partition 23 corresponding to the refrigerant outflow groove 23b to be dispersed.

The semiconductor elements 1 have uniform temperatures without thermal interference from the refrigerant, so that reliability of the semiconductor device can be improved.

Embodiment 4

A semiconductor device according to Embodiment 4 will be described next. FIG. 11 is a perspective view of the jacket 5 of the semiconductor device according to Embodiment 4. In Embodiment 4, the same components as those described in Embodiments 1 to 3 bear the same reference signs, and description thereof is omitted.

As illustrated in FIG. 11, in Embodiment 4, the jacket 5 has a different structure from that in Embodiment 3. The other members have the same structures, so that illustration and description thereof are omitted.

The jacket 5 has the refrigerant inlet 5a, the refrigerant outlet 5b, and the horizontal partition supports 5f. That is to say, the jacket 5 does not have the refrigerant inflow groove 5e in contrast to a case in Embodiment 3. There is a tendency for a pressure loss to increase because a flow to turn left and right of the refrigerant having flowed in through the refrigerant inlet 5a is thereby caused below the horizontal partition 23 to prevent an upward flow through the inflow openings 23a, but there is an advantage of simplification of processing of the jacket 5.

As described above, in the semiconductor device according to Embodiment 4, the jacket 5 has the refrigerant inlet 5a, the refrigerant outlet 5b, and the horizontal partition supports 5f. Processing of the jacket 5 can be simplified to suppress an increase in manufacturing cost of the jacket 5 and further an increase in manufacturing cost of the semiconductor device.

Embodiment 5

Figure 13:
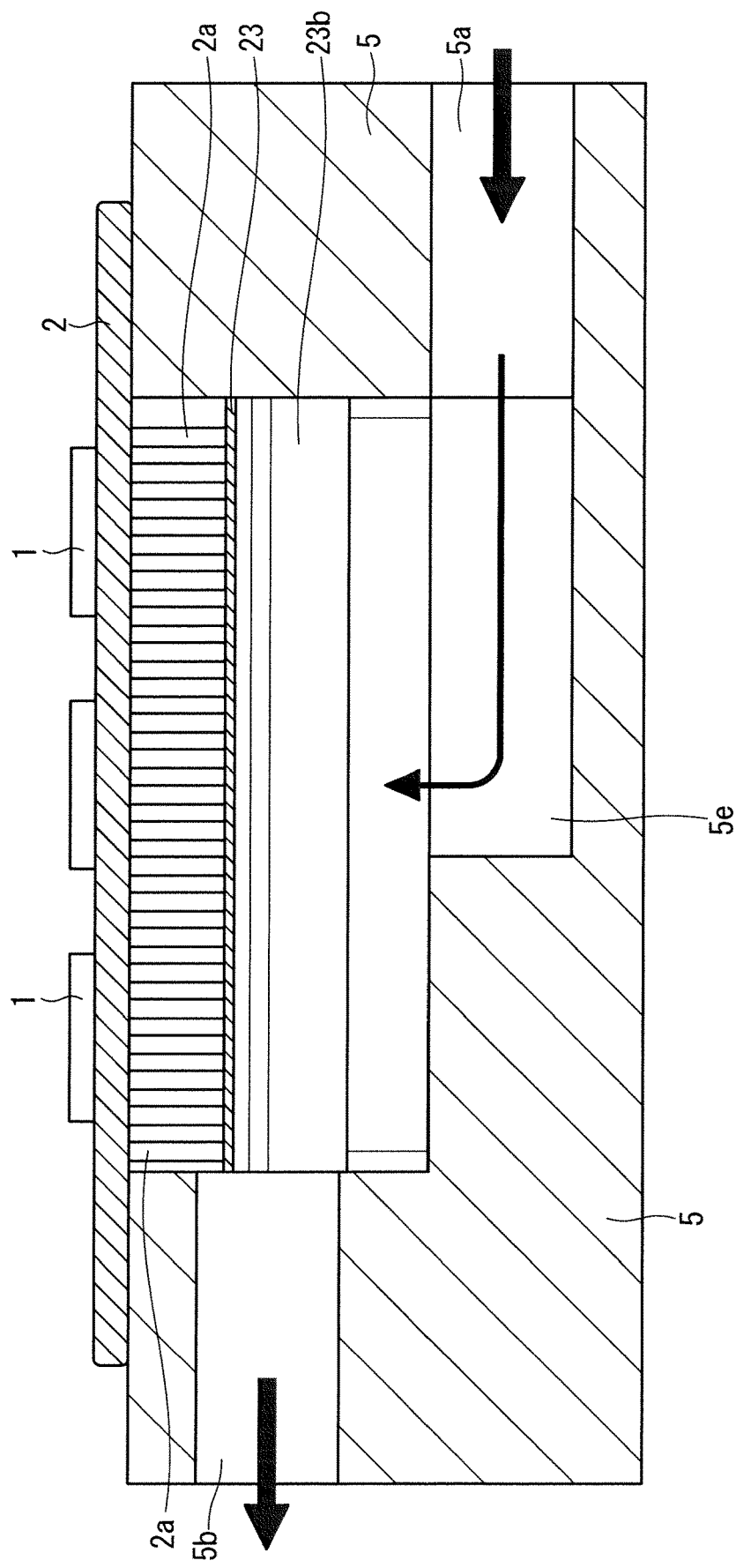
FIG. 13 is a sectional view of the semiconductor device according to Embodiment 5.

A semiconductor device according to Embodiment 5 will be described next. FIG. 12 is an exploded perspective view of the horizontal partition 23 and the jacket 5 of the semiconductor device according to Embodiment 5. FIG. 13 is a sectional view of the semiconductor device according to Embodiment 5, and, specifically, is a sectional view of the semiconductor device according to Embodiment 5 taken along the front-back direction. In Embodiment 5, the same components as those described in Embodiments 1 to 4 bear the same reference signs, and description thereof is omitted.

As illustrated in FIG. 12, in Embodiment 5, the jacket 5 has a different structure from that in Embodiment 3 The other members have the same structures, so that description thereof is omitted.

As illustrated in FIGS. 12 and 13, the jacket 5 has the refrigerant inlet 5a, the refrigerant outlet 5b, the refrigerant inflow groove 5e in communication with the refrigerant inlet 5a, and the horizontal partition supports 5f. The refrigerant inlet 5a and the refrigerant inflow groove 5e are at different locations from those in a case of Embodiment 3.

The refrigerant inflow groove 5e is located below a right end portion of the space inside the jacket 5 to extend in the front-back direction. The refrigerant inlet 5a extends, in the front-back direction, from the middle portion of the back wall of the jacket 5 to be in communication with the refrigerant inflow groove 5e. That is to say, the refrigerant inlet 5a is located in a surface of the jacket 5 opposite a surface in which the refrigerant outlet 5b is located in a state of being in communication with the refrigerant inflow groove 5e.

As described above, in the semiconductor device according to Embodiment 5, the refrigerant inlet 5a is located in the surface of the jacket 5 opposite the surface in which the refrigerant outlet 5b is located in the state of being in communication with the refrigerant inflow groove 5e. An effect similar to the effect obtained in Embodiment 3 can thus be obtained.

Embodiment 6

A semiconductor device according to Embodiment 6 will be described next. FIG. 14 is an exploded perspective view of the horizontal partition and the jacket of the semiconductor device according to Embodiment 6. FIG. 15 is a sectional view of the semiconductor device according to Embodiment 6, and, specifically, is a sectional view of the semiconductor device according to Embodiment 6 taken along the front-back direction. In Embodiment 6, the same components as those described in Embodiments 1 to 5 bear the same reference signs, and description thereof is omitted.

As illustrated in FIG. 14, in Embodiment 6, the jacket 5 has a different structure from that in Embodiment 3. The other members have the same structures, so that description thereof is omitted.

As illustrated in FIGS. 14 and 15, the jacket 5 has the refrigerant inlet 5a, the refrigerant outlet 5b, and the horizontal partition supports 5f That is to say, the jacket 5 does not have the refrigerant inflow groove 5e in contrast to the case in Embodiment 3.

As illustrated in FIGS. 14 and 15, the refrigerant inlet 5a is located in the bottom wall of the jacket 5 to be in communication with an interior of the jacket 5. More specifically, the refrigerant inlet 5a extends, in the vertical direction, from a center portion of the bottom wall of the jacket 5 to be in communication with the space inside the jacket 5.

As described above, in the semiconductor device according to Embodiment 6, the refrigerant inlet 5a is located in the bottom wall of the jacket 5 to be in communication with the interior of the jacket 5. Processing of the jacket 5 can be simplified to suppress the increase in manufacturing cost of the jacket 5 and further the increase in manufacturing cost of the semiconductor device.

While the invention has been described in detail, the foregoing description is in all aspects illustrative and not restrictive. It is therefore understood that numerous modifications not having been described can be devised without departing from the scope of the invention.

Embodiments of the present invention can freely be combined with each other, and can be modified or omitted as appropriate within the scope of the invention.

EXPLANATION OF REFERENCE SIGNS 1 semiconductor element, 2 base plate, 2a cooling fin, 3 horizontal partition, 4 vertical partition, 5 jacket, 5a refrigerant inlet, 5b refrigerant outlet, 5c inflow opening, 5e refrigerant inflow groove, 10 partition, 13 horizontal partition, 13a inflow opening, 13b outflow opening, 14 vertical partition, 14a refrigerant outflow groove, 20 partition, 23 horizontal partition, 23a inflow opening, 23b refrigerant outflow groove.

The invention claimed is:

1. A semiconductor device comprising:
a plurality of semiconductor elements;
a base plate having an upper surface on which the semiconductor elements are mounted;
a plurality of cooling fins disposed on a lower surface of the base plate;
a jacket having a refrigerant inlet through which a refrigerant flows in from an outside and a refrigerant outlet through which the refrigerant flows out to the outside, and disposed to surround the plurality of cooling fins on the lower surface of the base plate; and
a partition disposed below the plurality of cooling fins in the jacket to allow the refrigerant having flowed in through the refrigerant inlet to flow through the plurality of cooling fins and then flow out through the refrigerant outlet, wherein the partition has a plurality of inflow openings, each allowing the refrigerant, having flowed in through the refrigerant inlet to flow through the plurality of cooling fins, and the partition has a portion abutting the jacket on a side of the refrigerant inlet, and the plurality of inflow openings are each located to correspond to a respective one of the plurality of semiconductor elements, and are each sized to create a respective flow of refrigerant across the respective semiconductor element, and one outflow opening, located in the partition immediately below a region of the base plate in which the semiconductor elements are not disposed, and configured to receive the refrigerant from all the respective flows of the refrigerant across the respective semiconductor elements.

2. The semiconductor device according to claim 1, wherein the partition includes a horizontal partition located at a lower end of the plurality of cooling fins and a vertical partition located below the horizontal partition, and the plurality of inflow openings constitute at least one inflow opening is a refrigerant inflow-side gaps formed between one end of the horizontal partition on the side of the refrigerant inlet and an inner side wall of the jacket.

3. The semiconductor device according to claim 1, wherein the partition includes a horizontal partition located at a lower end of the plurality of cooling fins and a vertical partition located below the horizontal partition, and the horizontal partition has the plurality of inflow openings located immediately below a region of the base plate in which the respective one of the semiconductor elements is disposed.

4. The semiconductor device according to claim 3, wherein the vertical partition has a refrigerant outflow groove in communication with the outflow opening and the refrigerant outlet.

5. The semiconductor device according to claim 4, wherein the refrigerant having flowed through the plurality of cooling fins flows through the outflow opening and the refrigerant outflow groove, and flows out through the refrigerant outlet.

6. The semiconductor device according to claim 1, wherein arrangement of a plurality of cooling fins located to correspond to each of the inflow openings is the same.

7. The semiconductor device according to claim 3, wherein the refrigerant inlet and the refrigerant outlet face each other with the vertical partition disposed therebetween.

8. The semiconductor device according to claim 1, wherein the partition is a horizontal partition located at a lower end of the plurality of cooling fins, the horizontal partition has the plurality of inflow openings located immediately below a region of the base plate in which the respective one of the semiconductor elements is disposed, and the outflow opening constitutes a refrigerant outflow groove located immediately below a region of the base plate in which one of the semiconductor elements is not disposed and being in communication with the refrigerant outlet, and the refrigerant outflow groove is located at the same level as the refrigerant outlet.

9. A semiconductor device comprising:

at least one semiconductor element;

a base plate having an upper surface on which the at least one semiconductor element is mounted;

a plurality of cooling fins disposed on a lower surface of the base plate;

a jacket having a refrigerant inlet through which a refrigerant flows in from an outside and a refrigerant outlet through which the refrigerant flows out to the outside, and disposed to surround the plurality of cooling fins on the lower surface of the base plate; and a partition disposed below the plurality of cooling fins in the jacket to allow the refrigerant having flowed in through the refrigerant inlet to flow through the plurality of cooling fins and then flow out through the refrigerant outlet, wherein the partition has at least one inflow opening to allow the refrigerant having flowed in through the refrigerant inlet to flow through the plurality of cooling fins, a portion abutting the jacket on a side of the refrigerant inlet, and a refrigerant outflow groove located immediately below a region of the base plate in which the at least one semiconductor element is not disposed and being in communication with the refrigerant outlet, the at least one inflow opening is located to correspond to the at least one semiconductor element, the jacket further has a refrigerant inflow groove in communication with the refrigerant inlet, and the refrigerant inflow groove is located below the refrigerant outflow groove.

10. The semiconductor device according to claim 9, wherein the refrigerant inflow groove faces a portion of a lower surface of the partition corresponding to the refrigerant outflow groove, and the refrigerant having flowed in through the refrigerant inlet is jetted upward from the refrigerant inflow groove to impinge on the portion of the lower surface of the partition corresponding to the refrigerant outflow groove to be dispersed.

11. The semiconductor device according to claim 8, wherein the refrigerant inlet is located in a bottom wall of the jacket to be in communication with an interior of the jacket.

* * * * *